United States Patent
Kunii et al.

(10) Patent No.: US 8,796,697 B2
(45) Date of Patent: Aug. 5, 2014

(54) SEMICONDUCTOR DEVICE INCLUDING TRANSISTOR CHIPS HAVING OBLIQUE GATE ELECTRODE FINGERS

(71) Applicants: Tetsuo Kunii, Tokyo (JP); Seiichi Tsuji, Tokyo (JP); Motoyoshi Koyanagi, Tokyo (JP)

(72) Inventors: Tetsuo Kunii, Tokyo (JP); Seiichi Tsuji, Tokyo (JP); Motoyoshi Koyanagi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/803,515

(22) Filed: Mar. 14, 2013

(65) Prior Publication Data
US 2014/0014969 A1    Jan. 16, 2014

(30) Foreign Application Priority Data

Jul. 11, 2012 (JP) .................................. 2012-155501

(51) Int. Cl.
*H01L 27/08* (2006.01)
*H01L 29/16* (2006.01)

(52) U.S. Cl.
CPC ............ *H01L 27/08* (2013.01); *H01L 29/1608* (2013.01)
USPC 257/77; 257/499; 257/E27.016; 257/E29.089; 257/E29.091; 257/E29.084; 257/724; 257/731; 257/732; 257/698; 257/76; 257/664; 257/728; 257/678; 257/710; 257/729; 257/275; 257/287; 257/259; 257/704; 257/730; 257/734; 257/276; 257/277; 174/266

(58) Field of Classification Search
USPC ....... 257/724, 531.532, E29.342, E21.54, 77, 257/698, 76, E27.016, E29.089, E29.091, 257/E29.084, 664, 728, 678, 710, 729, 730, 257/731, 734, E23.193, 499, 275, 276, 277, 257/287, 259, E29.317, E21.45, 424, 704; 174/266; 333/33, 286, 302, 305, 306, 333/307; 330/126, 302, 51, 286, 295, 129; 438/167, 456, 432; 455/127, 326
See application file for complete search history.

(56) References Cited

U.S. PATENT DOCUMENTS

| 5,883,407 A * | 3/1999 | Kunii et al. ................... 257/275 |
| 6,054,900 A * | 4/2000 | Ishida et al. .................. 330/286 |
| 7,463,111 B2 * | 12/2008 | Inoue et al. ..................... 333/33 |

(Continued)

FOREIGN PATENT DOCUMENTS

| JP | 61-104674 A | 5/1986 |
| JP | 62-293781 A | 12/1987 |

(Continued)

*Primary Examiner* — Alexander Oscar Williams
(74) *Attorney, Agent, or Firm* — Leydig, Voit & Mayer Ltd.

(57) ABSTRACT

A semiconductor device includes: a package; an input matching circuit and an output matching circuit in the package; and transistor chips between the input matching circuit and the output matching circuit in the package. Each transistor chip includes a semiconductor substrate having long sides and short sides that are shorter than the long sides, and a gate electrode, a drain electrode and a source electrode on the semiconductor substrate. The gate electrode has gate fingers arranged along the long sides of the semiconductor substrate and a gate pad commonly connected to the gate fingers and connected to the input matching circuit via a first wire. The drain electrode is connected to the output matching circuit via a second wire. The long sides of the semiconductor substrates of the transistor chips are oblique with respect to an input/output direction extending from the input matching circuit to the output matching circuit.

10 Claims, 7 Drawing Sheets

(56) References Cited

U.S. PATENT DOCUMENTS

| | | | |
|---|---|---|---|
| 7,679,438 B2 * | 3/2010 | Tateoka et al. | 330/126 |
| 8,026,595 B2 * | 9/2011 | Takagi | 257/704 |
| 8,344,809 B2 * | 1/2013 | Barsegyan | 330/302 |
| 8,471,382 B2 * | 6/2013 | Takagi | 257/728 |
| 2002/0140024 A1 | 10/2002 | Aoki et al. | |
| 2004/0145034 A1 * | 7/2004 | Fujioka et al. | 257/664 |
| 2004/0232982 A1 * | 11/2004 | Ichitsubo et al. | 330/129 |
| 2009/0149150 A1 * | 6/2009 | Buer et al. | 455/326 |
| 2009/0189200 A1 * | 7/2009 | Takagi | 257/259 |
| 2012/0138954 A1 * | 6/2012 | Takagi | 257/77 |
| 2014/0070365 A1 * | 3/2014 | Viswanathan et al. | 257/531 |

FOREIGN PATENT DOCUMENTS

| | | | |
|---|---|---|---|
| JP | 63-28074 A | | 2/1988 |
| JP | 3-258005 A | * | 11/1991 |
| JP | 3-297201 A | * | 12/1991 |
| JP | 10-233404 A | * | 4/1994 |
| JP | 9-64063 A | | 3/1997 |
| JP | 6-104613 A | * | 9/1998 |
| JP | 2001-28425 A | * | 1/2001 |
| JP | 2002-299351 A | | 10/2002 |
| JP | 2007-274181 A | | 10/2007 |
| JP | 2008-141055 A | | 6/2008 |

* cited by examiner

SEMICONDUCTOR DEVICE INCLUDING TRANSISTOR CHIPS HAVING OBLIQUE GATE ELECTRODE FINGERS

BACKGROUND OF THE INVENTION

1. Field of the Invention

The present invention relates to a semiconductor device capable of improving output without increasing its package size and causing deterioration of its characteristics and reliability.

2. Background Art

High output semiconductor devices are required to amplify an inputted RF signal and output power of several W to several hundreds of W. The gate width of transistors used for such semiconductor devices needs to be several mm to several hundreds of mm. Transistors having such a large gate width need to be fitted into a package of merely several mm to several tens of mm in size. Thus, one to four or so transistor chips with an array of several tens to a hundred or so of gate fingers having a gate width (gate finger length) of several tens of μm to several hundreds of mm are arranged in a package.

Conventional semiconductor devices have a plurality of transistor chips arranged in a row so that their respective input and output sides are oriented toward the same direction. Moreover, a semiconductor device with chips located before or after each other is also proposed (e.g., see Japanese Patent Laid-Open No. 2007-274181).

Furthermore, in a transistor chip with a plurality of gate fingers arranged in a row, a line length from a gate pad to each gate finger varies from one finger to another, which produces phase differences. Therefore, an idea is proposed that a plurality of gate fingers are arranged in a V shape so as to equalize line lengths from the gate pad to the respective gate fingers (e.g., see Japanese Patent Laid-Open No. 61-104674). It is thereby possible to reduce phase differences and achieve a high gain.

SUMMARY OF THE INVENTION

To increase output, the gate width needs to be increased. However, the number of chips that can be arranged and the lateral width of each chip of a semiconductor device with a plurality of transistor chips arranged in a row are restricted by the lateral width of its package. Therefore, increasing the number of chips or increasing the lateral width of each chip results in an increase in the lateral width of the package, which leads to a cost increase. Furthermore, when chips are arranged before or after each other, only ends of the chips can overlap each other to avoid wire contact, which prevents the package size from being reduced sufficiently.

Furthermore, to increase the gate width without increasing the package size, the length of each gate finger (unit gate width) may be increased or the finger spacing may be narrowed to increase the number of fingers. However, increasing the length of the gate finger results in a decrease in the gain. Furthermore, narrowing the finger spacing may cause heat to concentrate, resulting in a rise of channel temperature during operation. As a result, characteristics or reliability deteriorates.

Furthermore, when a plurality of gate fingers are arranged in one row in a lateral direction, a heat generating area during operation is concentrated on a rectangular area in which the fingers are arranged. In contrast, if the plurality of gate fingers are arranged in a V shape, the heat generating area extends. However, since gate fingers at ends of mutual transistor cells are located adjacent to each other on the boundary of the adjacent transistor cells, heat is concentrated on the cell boundary. Moreover, since the line lengths from the gate pad to the respective gate fingers need to be equalized, the overlapping area between the adjacent gate fingers cannot be reduced further. For this reason, heat concentration cannot be reduced sufficiently, resulting in a temperature rise and deterioration of characteristics or reliability.

In view of the above-described problems, an object of the present invention is to provide a semiconductor device capable of improving output without increasing its package size and causing deterioration of its characteristics and reliability.

According to the present invention, a semiconductor device includes: a package; an input matching circuit and an output matching circuit in the package; and a plurality of transistor chips between the input matching circuit and the output matching circuit in the package. Each transistor chip includes a rectangular semiconductor substrate having long sides and short sides being shorter than the long sides, and a gate electrode, a drain electrode and a source electrode on the semiconductor substrate. The gate electrode has a plurality of gate fingers arranged along the long sides of the semiconductor substrate and a gate pad commonly connected to the plurality of gate fingers and connected to the input matching circuit via a wire. The drain electrode is connected to the output matching circuit via a wire. The long sides of the semiconductor substrates of the plurality of transistor chips are diagonal with respect to an input/output direction from the input matching circuit to the output matching circuit.

The present invention makes it possible to improve output without increasing its package size and causing deterioration of its characteristics and reliability.

Other and further objects, features and advantages of the invention will appear more fully from the following description.

DETAILED DESCRIPTION OF THE PREFERRED EMBODIMENTS

A semiconductor device according to the embodiments of the present invention will be described with reference to the drawings. The same components will be denoted by the same symbols, and the repeated description thereof may be omitted.

First Embodiment

Figure 1:
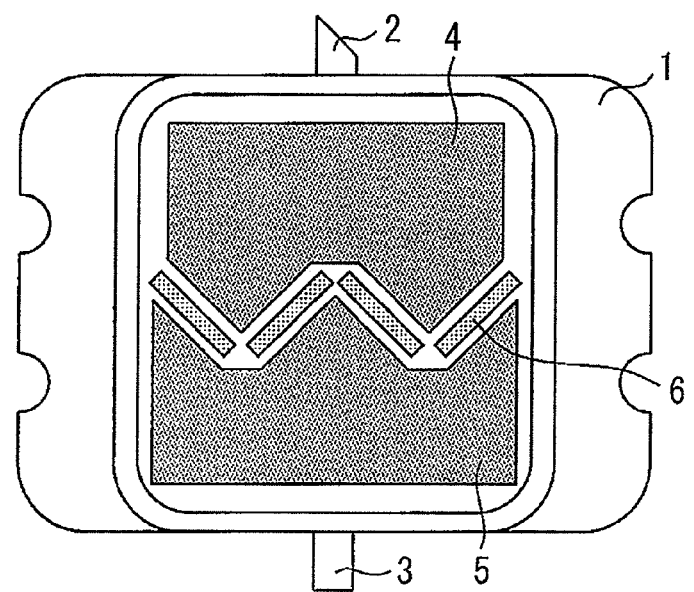
FIG. 1 is a plan view illustrating a semiconductor device according to the first embodiment of the present invention.
Figure 2:
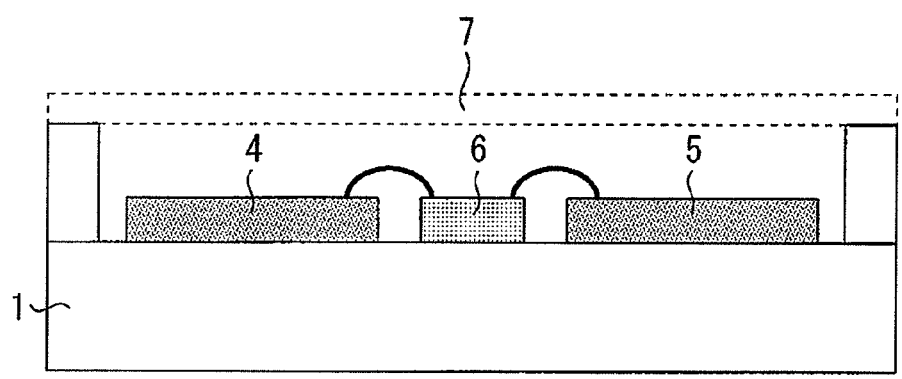
FIG. 2 is a cross-sectional view along a line I-II in FIG. 1.

FIG. 1 is a plan view illustrating a semiconductor device according to the first embodiment of the present invention. FIG. 2 is a cross-sectional view along a line I-II in FIG. 1. An RF input terminal 2 for inputting an RF signal and an RF output terminal 3 for outputting an RF signal are provided on mutually opposite sides of a substantially rectangular package 1 in plan view. An input matching circuit 4 and an output matching circuit 5 are provided in the package 1, and are connected to the RF input terminal 2 and the RF output terminal 3 respectively. A plurality of transistor chips 6 are provided between the input matching circuit 4 and the output matching circuit 5 in the package 1. The top surface of the package 1 is covered with a lid 7.

Figure 3:
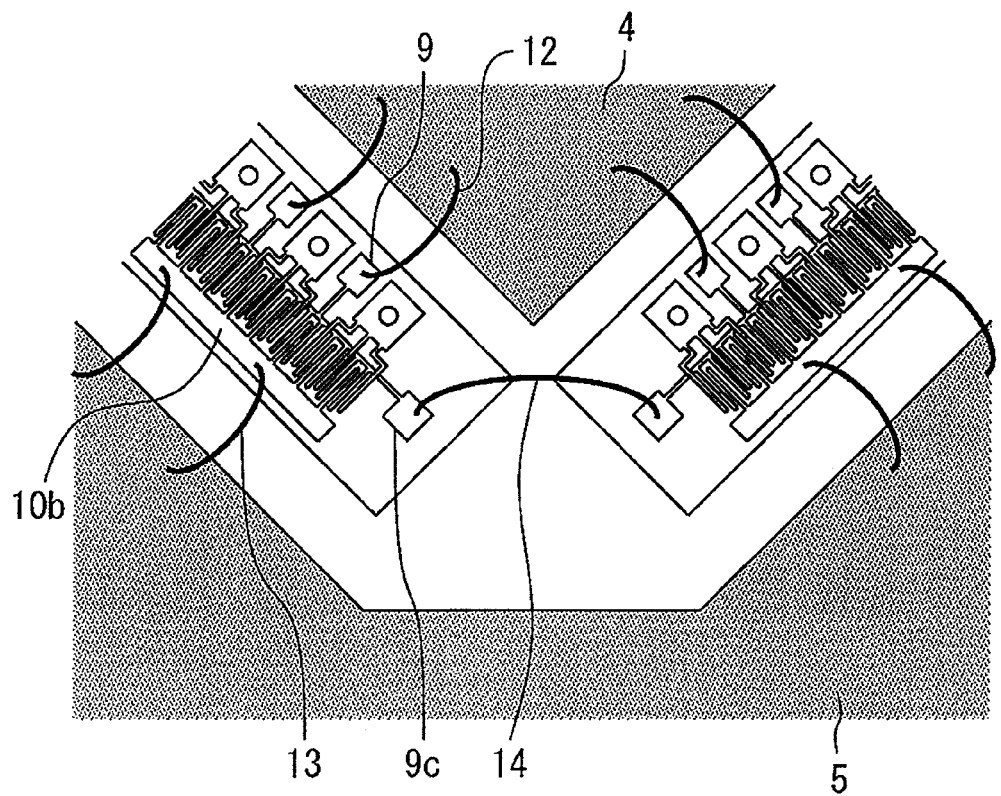
FIG. 3 is an enlarged plan view of the transistor chip in FIG. 1.
Figure 4:
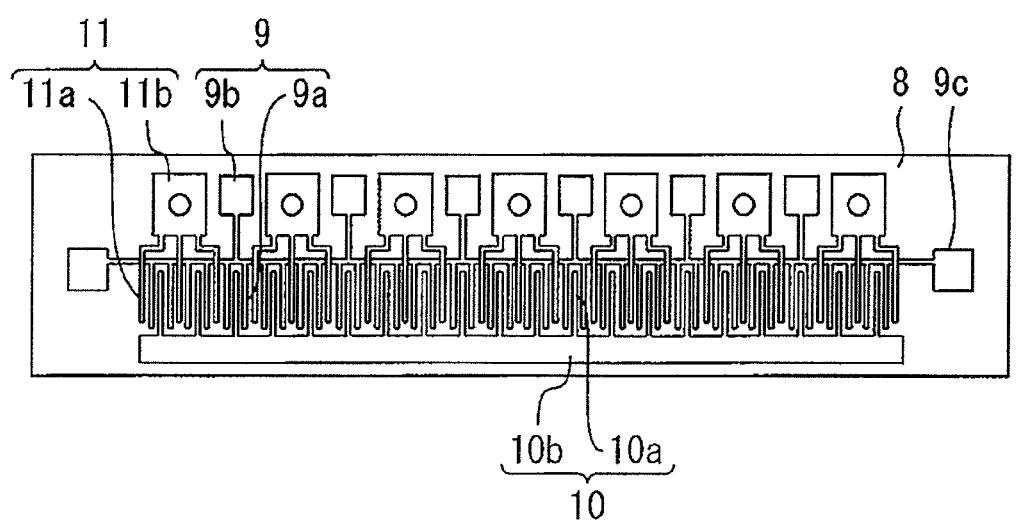
FIG. 4 is a plan view illustrating the transistor chip according to the first embodiment of the present invention.

FIG. 3 is an enlarged plan view of the transistor chip in FIG. 1. FIG. 4 is a plan view illustrating the transistor chip according to the first embodiment of the present invention. Each transistor chip 6 includes a rectangular semiconductor substrate 8 having long sides and short sides being shorter than the long sides, and a gate electrode 9, a drain electrode 10 and a source electrode 11 provided on the semiconductor substrate 8.

The gate electrode 9 has a plurality of gate fingers 9a arranged along the long sides of the semiconductor substrate 8 and a gate pad 9b commonly connected to the plurality of gate fingers 9a. The drain electrode 10 has a plurality of drain fingers 10a arranged along the long sides of the semiconductor substrate 8 and a drain pad 10b commonly connected to the plurality of drain fingers 10a. The source electrode 11 has a plurality of source fingers 11a arranged along the long sides of the semiconductor substrate 8 and a source pad 11b commonly connected to the plurality of source fingers 11a. The gate pad 9b is connected to the input matching circuit 4 via a gold wire 12 and the drain pad 10b of the drain electrode 10 is connected to the output matching circuit 5 via a gold wire 13.

A chip coupling gate pad 9C connected to the gate electrode 9 is provided in the vicinity of the short side. The chip coupling gate pads 9c of the adjacent transistor chips 6 are mutually connected via a gold wire 14.

In the present embodiment, the long sides of the semiconductor substrates 8 of the plurality of transistor chips 6 are diagonal with respect to the input/output direction from the input matching circuit 4 to the output matching circuit 5. Here, the input matching circuit 4 and the output matching circuit 5 each include a pattern whereby matching is achieved for each transistor cell in the chip, and those patterns are wired for each cell and combined into a tournament shape. Therefore, even when the plurality of transistor chips 6 are diagonally arranged, the chips can be combined for each cell inside the chip while keeping symmetry. Chip combination while keeping symmetry is also possible.

Figure 5:
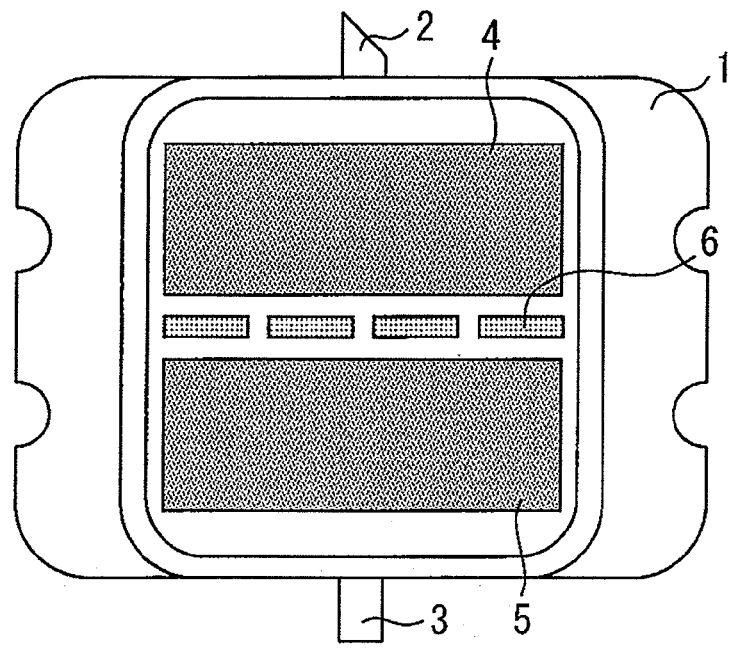
FIG. 5 is a plan view illustrating a semiconductor device according to a comparative example.
Figure 6:
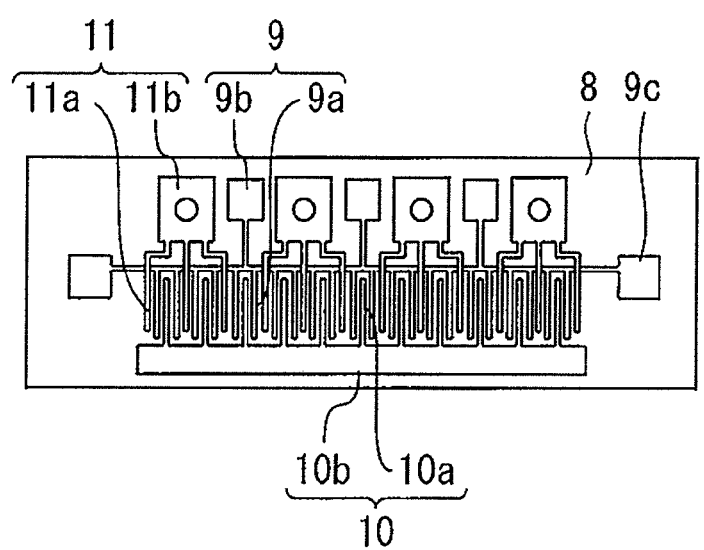
FIG. 6 is a plan view illustrating transistor chips according to the comparative example.

Next, effects of the present embodiment will be described in comparison with a comparative example. FIG. 5 is a plan view illustrating a semiconductor device according to a comparative example. FIG. 6 is a plan view illustrating transistor chips according to the comparative example. In the comparative example, four transistor chips 6 of 3.2 mm×0.56 mm in size are arranged in a row so that their respective input and output sides are oriented toward the same direction.

On the other hand, in the present embodiment, the four transistor chips 6 are diagonally arranged at an angle of 45 degrees with respect to the input/output direction. This makes it possible to expand the chip size in the lateral direction to $(3.2-0.56/\sqrt{2}) \times \sqrt{2}$ mm=3.97 mm without increasing the package size. As a result, the present embodiment can increase the number of fingers without changing the length (unit gate width) of the gate fingers or spacing of the fingers and can improve the output by approximately 24% compared to the comparative example. Thus, the present embodiment can improve the output without increasing the package size and causing characteristics and reliability to deteriorate.

Figure 7:
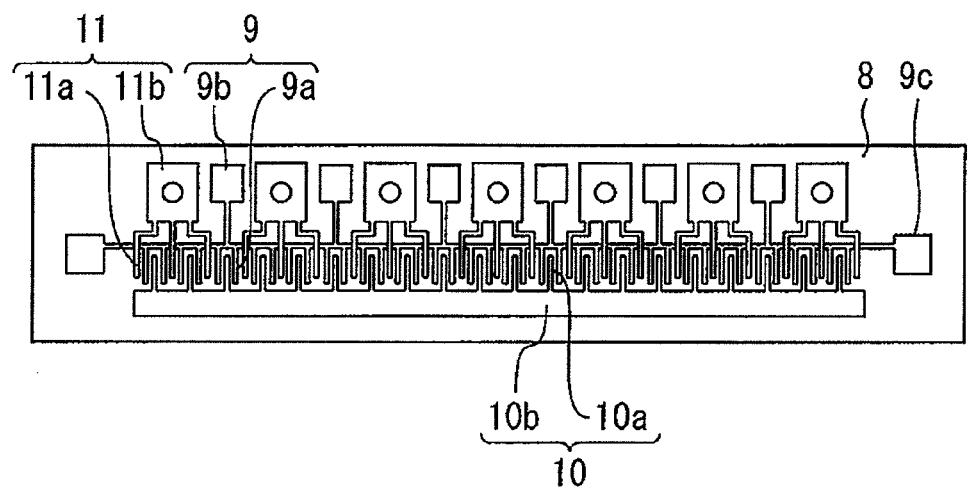
FIG. 7 is a plan view illustrating modification example 1 of the transistor chips according to the first embodiment of the present invention.

FIG. 7 is a plan view illustrating modification example 1 of the transistor chips according to the first embodiment of the present invention. Compared to the chips in FIG. 4 of the first embodiment, the chip size in the lateral direction and the number of gate fingers 9a are the same, and the length (unit gate width) of each gate finger 9a is smaller. Compared to the chips in FIG. 6 in the comparative example, this makes it possible to increase the number of gate fingers 9a while reducing the length of each gate finger 9a and achieve the same total gate width. Therefore, the gain can be improved while keeping the same output as that in the comparative example.

Figure 8:
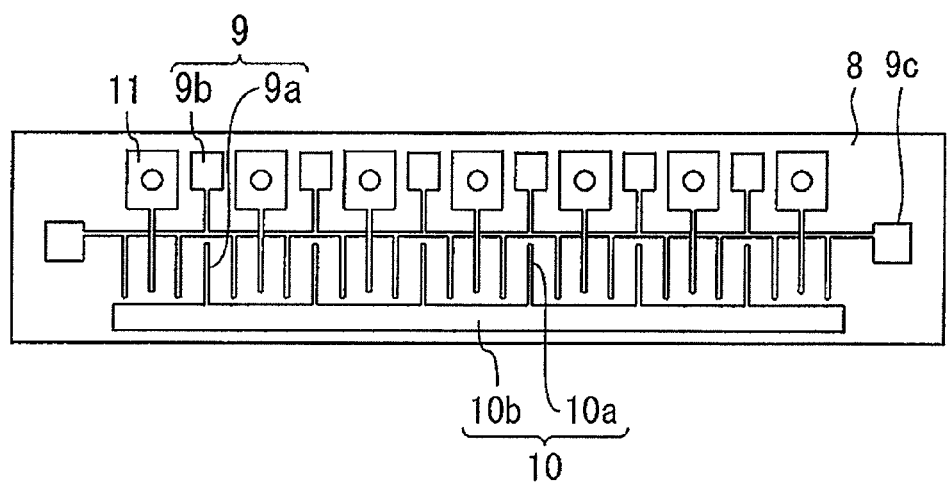
FIG. 8 is a plan view illustrating modification example 2 of the transistor chips according to the first embodiment of the present invention.

FIG. 8 is a plan view illustrating modification example 2 of the transistor chips according to the first embodiment of the present invention. Compared to the chips in FIG. 4 of the first embodiment, the chip size in the lateral direction and the length (unit gate width) of each gate finger 9a are the same but the number of gate fingers 9a is smaller. Compared to the chips in FIG. 6 in the comparative example, this makes it possible to expand the spacing of the gate fingers 9a while keeping the same unit gate width, the same number of the gate fingers 9a and the same total gate width. Therefore, it is possible to improve heat dissipation with the same output as that in the comparative example.

In the present embodiment, in order to couple the adjacent transistor chips 6 via the connection gate pad 9b, the plurality of transistor chips 6 need to be oriented in a staggered configuration. However, when the chips need not be coupled, the plurality of transistor chips 6 may be diagonally arranged in the same orientation.

Second Embodiment

Figure 9:
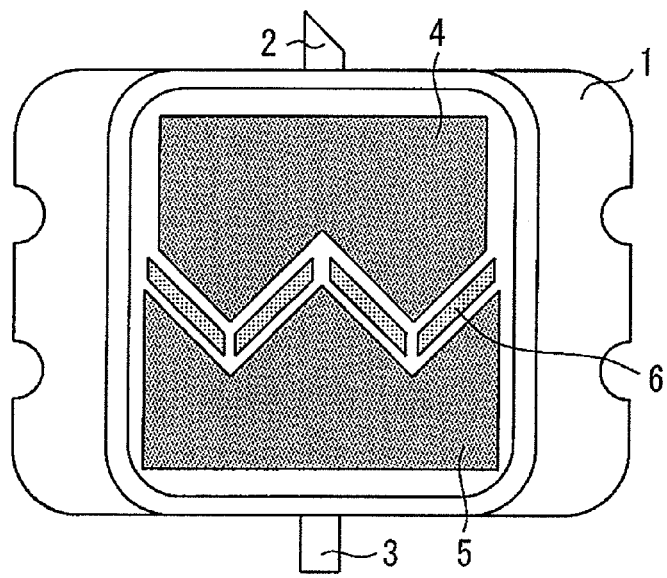
FIG. 9 is a plan view illustrating a semiconductor device according to the second embodiment of the present invention.
Figure 10:
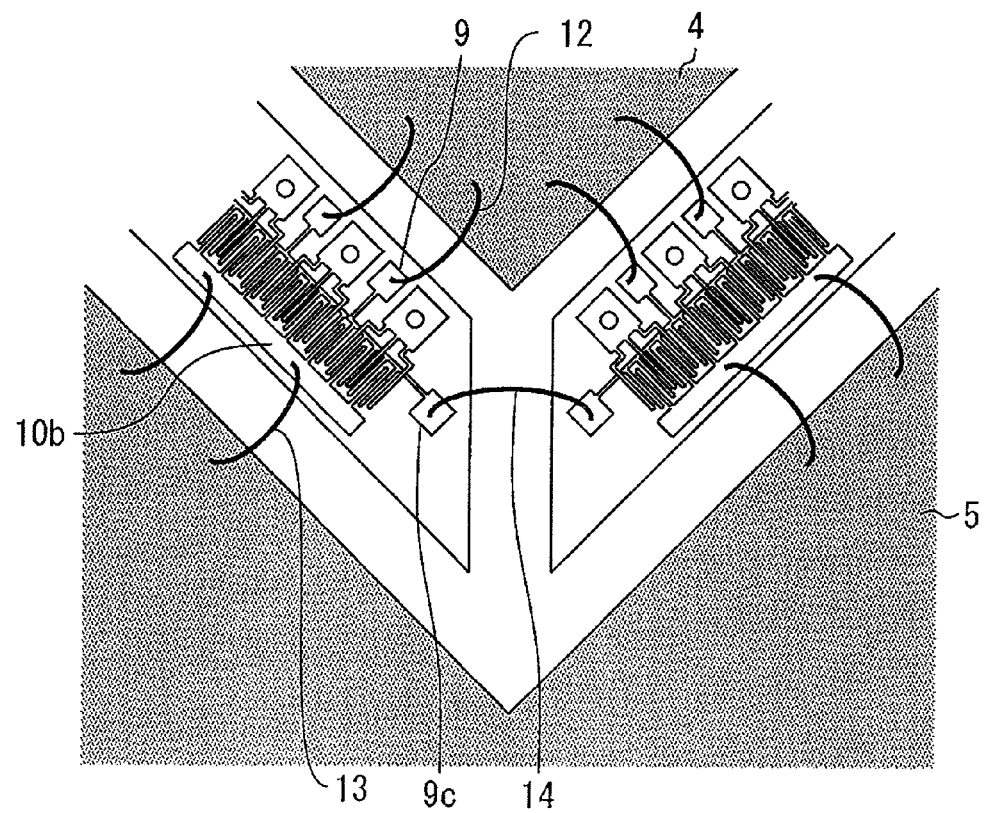
FIG. 10 is an enlarged plan view of the transistor chips in FIG. 9.

FIG. 9 is a plan view illustrating a semiconductor device according to the second embodiment of the present invention. FIG. 10 is an enlarged plan view of the transistor chips in FIG. 9. The shape of the transistor chip 6 is not a normal rectangle but a parallelogram. The short sides of the semiconductor substrates 8 of the plurality of transistor chips 6 are parallel with respect to the input/output direction.

If the rectangular transistor chip 6 is provided with chip coupling gate pads 9c at the ends of the chip, the area of the region where the gate fingers 9a are provided decreases. In contrast, the present embodiment allows the chip coupling gate pads 9c to be provided in gaps between the chips, and can thereby expand the area of the region where the gate fingers 9a are provided. Therefore, the output can be further improved without increasing the package size.

The semiconductor substrate 8 of the transistor chip 6 is made of SiC and a GaN-based HEMT is provided thereon. Here, if the semiconductor substrate 8 is cut in a direction different from the plane azimuth, a crack may be produced along the plane azimuth when stress is applied to a chip end.

Thus, a SiC substrate of hexagonal crystal whose plane azimuth is a 60-degree direction is used and if the cleavage planes of the long side are <−1100> and <1-100>, the short side is inclined by 60 degrees with respect to the long side and is cut along the cleavage planes <−1010> and <10-10> or cleavage planes <0-110> and <01-10>. It is thereby possible to suppress the generation of cracks when stress is applied.

High output is required for a final-stage amplifier of an MMIC in particular. Therefore, the semiconductor device according to the first or second embodiment applied to the final stage of the MMIC is particularly effective. Furthermore, since the transistor chip 6 whose semiconductor substrate 8 is formed of SiC has a high withstand voltage characteristic and a high maximum allowable current density, the chip can be downsized. Using this downsized chip allows a semiconductor device incorporating this chip to be downsized as well. Moreover, since the chip has high heat-resistance, radiator fins of the heat sink can be downsized and its water-cooling part can be replaced by an air-cooling system, which further allows the semiconductor device to be downsized. Furthermore, since the chip has a low power loss and demonstrates high efficiency, a high efficiency semiconductor device can be provided.

Third Embodiment

Figure 11:
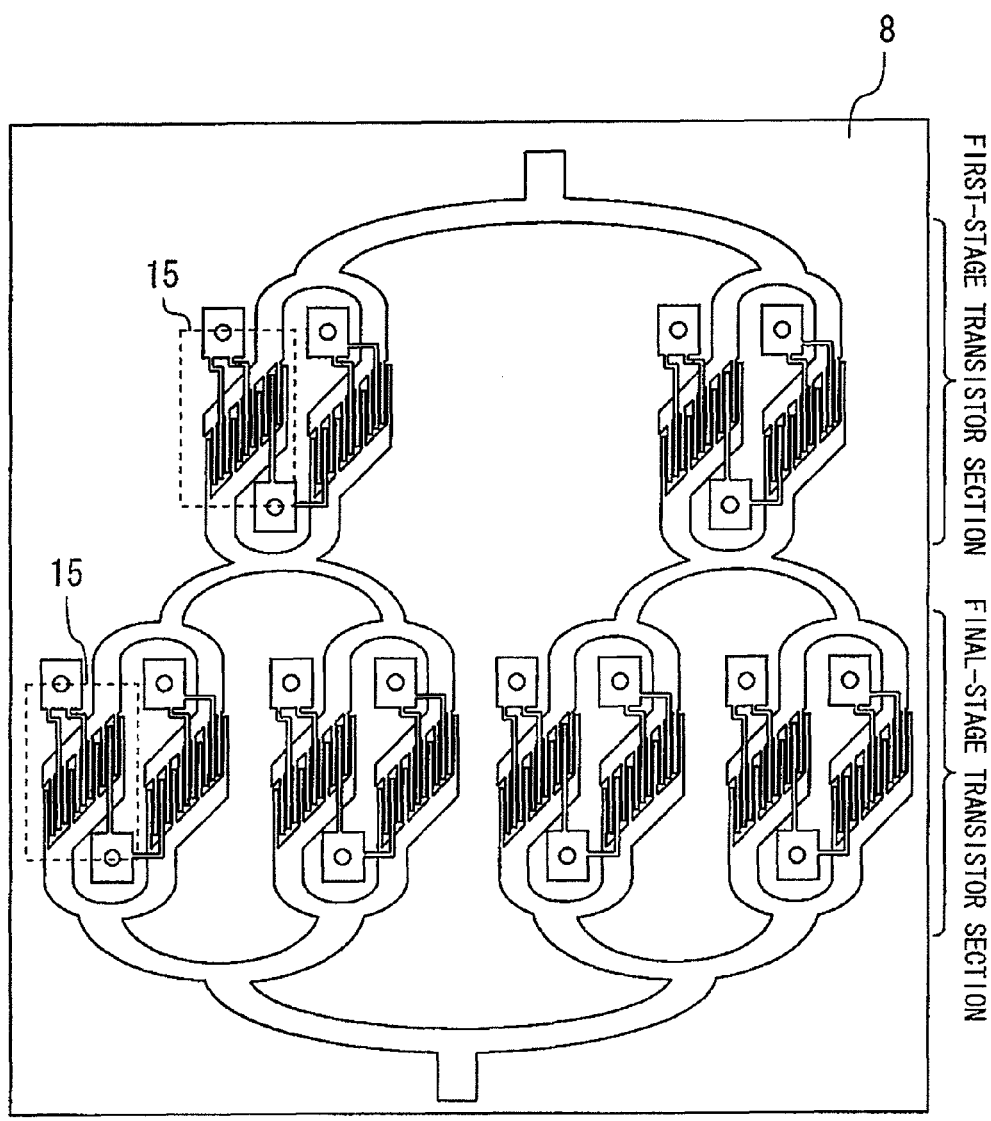
FIG. 11 is a plan view illustrating a semiconductor device according to the third embodiment of the present invention.
Figure 12:
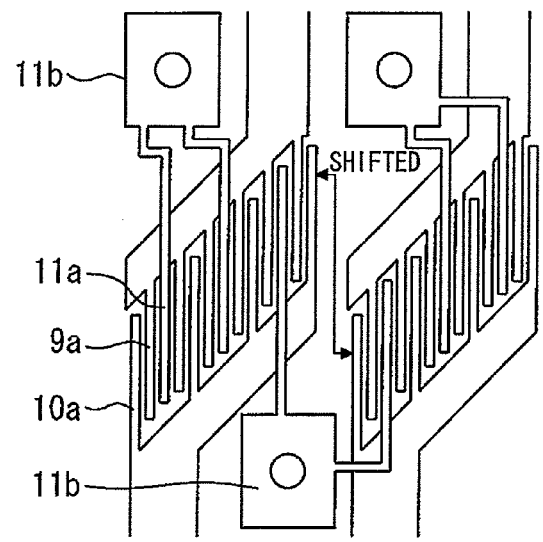
FIG. 12 is a partially enlarged plan view of FIG. 11.

FIG. 11 is a plan view illustrating a semiconductor device according to the third embodiment of the present invention. FIG. 12 is a partially enlarged plan view of FIG. 11. This semiconductor device is an MMIC including a first-stage transistor section that amplifies an input signal and a final-stage transistor section that further amplifies the output signal A plurality of transistor cells 15 are provided on a semiconductor substrate 8. In each transistor cell 15, a plurality of gate fingers 9a are arranged in a diagonal rectilinear form. On the boundary between adjacent transistor cells 15, the gate fingers 9a at the ends of the transistor cells 15 are shifted from each other. This prevents heat from being concentrated on the cell boundary and prevents deterioration of characteristics and reliability caused by a temperature rise. According to a simple thermal resistance calculation result using a simulation, the present embodiment can reduce the thermal resistance value by approximately 20% compared to an apparatus with a plurality of gate fingers 9a arranged in a row in a lateral direction.

With such excellent heat dissipation, it is possible to narrow the gate finger spacing, increase the number of fingers and increase the total gate width without changing the heat resistance per gate width. Thus, it is possible to improve output without increasing the package size and without causing characteristics and reliability to deteriorate.

In the present embodiment, the array of gate fingers 9a is changed for each cell, but the array may be changed for every plurality of cells or the array may be changed a plurality of times within one cell.

Fourth Embodiment

Figure 13:
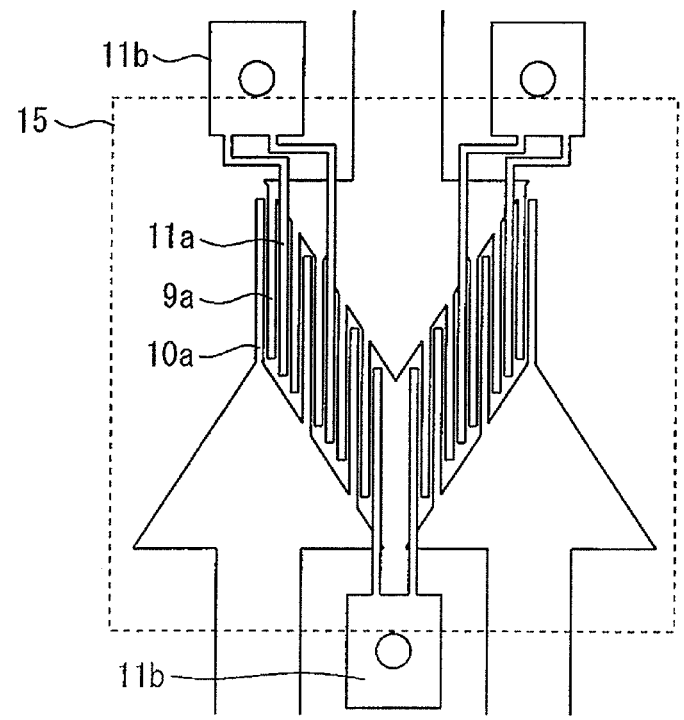
FIG. 13 is a partially enlarged plan view of a semiconductor device according to the fourth embodiment of the present invention.

FIG. 13 is a partially enlarged plan view of a semiconductor device according to the fourth embodiment of the present invention. As in the case of the third embodiment, a plurality of transistor cells 15 are provided on a semiconductor substrate 8. A plurality of gate fingers 9a are shifted little by little from one another in the finger direction and the shifting direction is reversed at the center of the transistor cell 15, the gate fingers 9a being arranged in a V shape.

The line length from a gate pad 9b to the gate finger 9a at the center is longer than the line length from the gate pad 9b to the gate finger 9a at the end. Such an elongated V-shaped arrangement of the plurality of gate fingers 9a reduces the overlapping area between adjacent gate fingers 9a compared to the V-shaped arrangement in which line lengths from the gate pad 9b to the respective gate fingers 9a are made to be the same. For this reason, the heat concentration can be reduced sufficiently.

With such excellent heat dissipation, it is possible to narrow the spacing of gate fingers 9a, increase the number of fingers and increase the total gate width without changing the heat resistance per gate width. Thus, it is possible to improve output without increasing the package size and without causing characteristics and reliability to deteriorate.

Furthermore, it is also possible to narrow the finger spacing and reduce the unit gate width without changing the chip size and total gate width. This makes it possible to improve the gain without increasing the package size and without causing characteristics and reliability to deteriorate.

In the present embodiment, the shifting direction of the gate fingers 9a is reversed to the opposite direction at the cell center, but the shifting direction may be reversed every plurality of cells or may be reversed a plurality of times within one cell. The period of reversing the shifting direction may be flexibly changed depending on the layout of the entire MMIC allowing a design with a high degree of freedom.

Furthermore, in Embodiments 3 and 4, the source pad 11b is also provided on the drain side to reduce a source inductance, but the source pad 11b may be provided only on the gate side without providing the source pad 11b on the drain side. Furthermore, combining the structure of the third or fourth embodiment or with the apparatus of the first or second embodiment makes it possible to further improve output.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-155501, filed on Jul. 11, 2012, including specification, claims, drawings, and summary, on which the Convention priority of the present application is based, is incorporated herein by reference in its entirety.

What is claimed is:
1. A semiconductor device comprising:
a package;
an input matching circuit and an output matching circuit in the package; and
a plurality of transistor chips between the input matching circuit and the output matching circuit in the package, wherein
each transistor chip includes a semiconductor substrate having two long sides and two short sides, which are shorter than the long sides, and a gate electrode, a drain electrode, and a source electrode on the semiconductor substrate,
the gate electrode has a plurality of gate fingers arranged along the long sides of the semiconductor substrate, and a gate pad commonly connected to the plurality of gate fingers and connected to the input matching circuit via a first wire,
the drain electrode is connected to the output matching circuit via a second wire, and
the long sides of the semiconductor substrates of the plurality of transistor chips are oblique with respect to an input/output direction extending from the input matching circuit to the output matching circuit.

2. The semiconductor device according to claim 1, wherein each transistor chip includes a chip coupling gate pad connected to the gate electrode and located proximate one of the short sides, the chip coupling gate pads of adjacent transistor chips are mutually connected via a third wire, and the short sides of the semiconductor substrates of the plurality of transistor chips are parallel to the input/output direction.

3. The semiconductor device according to claim 2, wherein the short sides lie along cleavage planes of the semiconductor substrate.

4. The semiconductor device according to claim 3, wherein the semiconductor substrate of each transistor chip is SiC, and respective short sides of each of the semiconductor substrates are inclined by 60 degrees with respect to respective long sides of each of the semiconductor substrates.

5. The semiconductor device according to claim 1, including a plurality of transistor cells on the semiconductor substrate of each transistor chip, wherein the plurality of gate fingers are arranged in a diagonal rectilinear form in each transistor cell, and the gate fingers, at ends of adjacent transistor cells, are shifted from each other on a boundary between the adjacent transistor cells.

6. The semiconductor device according to claim 1, wherein the plurality of gate fingers are arranged in a V shape, and length of a line from the gate pad to a center of one of the gate fingers is longer than length of a line from the gate pad to an end of the gate finger.

7. The semiconductor device according to claim 1, wherein the semiconductor substrate of each transistor chip is rectangular.

8. The semiconductor device according to claim 2, wherein the semiconductor substrate of each transistor chip is rectangular.

9. The semiconductor device according to claim 1, wherein the two long sides of the semiconductor substrate are parallel to each other, the two short sides are parallel to each other, and the long sides are oblique to the short sides.

10. The semiconductor device according to claim 2, wherein the two long sides of the semiconductor substrate are parallel to each other, the two short sides are parallel to each other, and the long sides are oblique to the short sides.

* * * * *